US011888337B2

(12) United States Patent
Baarman et al.

(10) Patent No.: US 11,888,337 B2
(45) Date of Patent: Jan. 30, 2024

(54) INPUT PARASITIC METAL DETECTION

(71) Applicant: PHILIPS IP VENTURES B.V., Eindhoven (NL)

(72) Inventors: David W. Baarman, Fennville, MI (US); Joshua K. Schwannecke, Grand Rapids, MI (US); Neil W. Kuyvenhoven, Ada, MI (US); Esai E. Umenei, Grand Rapids, MI (US); Dale R. Liff, Kent, OH (US); Andrew C. Zeik, Hudson, OH (US); Mark A. Blaha, Twinsburg, OH (US); Jason L. Amistadi, Lyndhurst, OH (US); Robert D Gruich, Copley, OH (US)

(73) Assignee: Philips I.P. Ventures B.V., Eindhoven (NL)

(*) Notice: Subject to any disclaimer, the term of this patent is extended or adjusted under 35 U.S.C. 154(b) by 364 days.

(21) Appl. No.: 17/109,269

(22) Filed: Dec. 2, 2020

(65) Prior Publication Data

US 2021/0083522 A1 Mar. 18, 2021

Related U.S. Application Data

(63) Continuation of application No. 15/350,191, filed on Nov. 14, 2016, now Pat. No. 10,862,335, which is a (Continued)

(51) Int. Cl.
*G01R 21/00* (2006.01)
*G01V 3/02* (2006.01)
(Continued)

(52) U.S. Cl.
CPC ............ *H02J 7/0047* (2013.01); *G01R 21/00* (2013.01); *G01V 3/02* (2013.01); *H01F 38/14* (2013.01);
(Continued)

(58) Field of Classification Search
CPC .......... H02J 7/0047; H02J 50/12; H02J 50/60; H02J 50/70; H02J 50/90; H02J 7/025;
(Continued)

(56) References Cited

U.S. PATENT DOCUMENTS 4,654,573 A    3/1987  Rough et al.
4,800,328 A *  1/1989  Bolger .................... B60L 5/005
                                                    320/135
(Continued)

FOREIGN PATENT DOCUMENTS

DE         19741279        3/1999
EP         0533247         3/1993
(Continued)

OTHER PUBLICATIONS

International Search Report and Written Opinion of the International Searching Authority for International Application No. PCT/US2011/023994 dated Mar. 2, 2012.

*Primary Examiner* — Elim Ortiz

(57) ABSTRACT

A system and method of controlling inductive power transfer in an inductive power transfer system and a method for designing an inductive power transfer system with power accounting. The method of controlling inductive power transfer including measuring a characteristic of input power, a characteristic of power in the tank circuit, and receiving information from a secondary device. Estimating power consumption based on the measured characteristic of tank circuit power and received information and comparing the measured characteristic of input power, the information from the secondary device, and the estimated power consumption to determine there is an unacceptable power loss. The method for designing an inductive power transfer system with power accounting including changing the distance between a primary side and a secondary side and changing a load of the secondary side. For each distance (Continued)

between the primary side and the secondary side and for each load, measuring a circuit parameter on the primary side in the tank circuit and a circuit parameter on the secondary side during the transfer of contactless energy. The method further including selecting a formula to describe power consumption in the system during the transfer of contactless energy based on coefficients and the circuit parameters, and determining the coefficients using the measured circuit parameters.

45 Claims, 4 Drawing Sheets

Related U.S. Application Data continuation of application No. 14/090,582, filed on Nov. 26, 2013, now Pat. No. 9,524,822, which is a continuation of application No. 13/022,944, filed on Feb. 8, 2011, now Pat. No. 8,620,484.

(60) Provisional application No. 61/302,349, filed on Feb. 8, 2010.

(51) Int. Cl.
| | | |
|---|---|---|
| *H01F 38/14* | (2006.01) | |
| *H02J 50/12* | (2016.01) | |
| *H02J 50/60* | (2016.01) | |
| *H02J 7/00* | (2006.01) | |
| *H02J 50/70* | (2016.01) | |
| *H02J 50/90* | (2016.01) | |

(52) U.S. Cl.
CPC .............. *H02J 50/12* (2016.02); *H02J 50/60* (2016.02); *H02J 50/70* (2016.02); *H02J 50/90* (2016.02)

(58) Field of Classification Search
CPC ......... H02J 50/005; G01R 21/00; G01V 3/02; H01F 38/14
See application file for complete search history.

(56) References Cited

U.S. PATENT DOCUMENTS

| | | | |
|---|---|---|---|
| 5,734,254 A | 3/1998 | Stephens | |
| 6,028,413 A | 2/2000 | Brockmann | |
| 6,057,668 A | 5/2000 | Chao | |
| 6,118,249 A | 9/2000 | Brockmann et al. | |
| 6,756,697 B2 | 6/2004 | Mizutani et al. | |
| 7,118,240 B2* | 10/2006 | Baarman | A61L 2/10 |
| | | | 362/86 |
| 7,212,414 B2* | 5/2007 | Baarman | H05B 41/36 |
| | | | 363/16 |
| 7,248,017 B2* | 7/2007 | Cheng | H01F 38/14 |
| | | | 320/108 |
| 7,518,360 B2 | 4/2009 | Goldfine et al. | |
| 8,620,484 B2 | 12/2013 | Baarman | |
| 2002/0154518 A1 | 10/2002 | Elferich et al. | |
| 2002/0158512 A1 | 10/2002 | Mizutani et al. | |
| 2004/0130916 A1 | 7/2004 | Baarman | |
| 2004/0145342 A1 | 7/2004 | Lyon | |
| 2005/0068019 A1 | 3/2005 | Nakamura et al. | |
| 2007/0228833 A1 | 10/2007 | Stevens et al. | |
| 2009/0322158 A1 | 12/2009 | Stevens et al. | |
| 2012/0175967 A1 | 7/2012 | Dibben | |
| 2012/0235636 A1 | 9/2012 | Partovi | |

FOREIGN PATENT DOCUMENTS

| | | |
|---|---|---|
| EP | 0903830 | 3/1999 |
| EP | 201740 | 1/2009 |
| JP | H08251843 | 9/1996 |
| JP | H09103037 | 4/1997 |
| JP | 2000295796 | 10/2000 |
| JP | 2001275282 | 9/2003 |
| JP | 2003264934 | 9/2003 |
| JP | 2006230032 | 8/2006 |
| JP | 2008312434 | 12/2008 |
| JP | 2010284006 | 12/2010 |
| JP | 2011083094 | 4/2011 |
| WO | 2004015885 | 2/2004 |
| WO | 2005031944 | 4/2005 |
| WO | 2005109598 | 11/2005 |
| WO | 2006057409 | 6/2006 |
| WO | 2008114268 | 9/2008 |
| WO | 2009014125 | 1/2009 |
| WO | 200908115 | 7/2009 |
| WO | 2010062201 | 6/2010 |

\* cited by examiner

INPUT PARASITIC METAL DETECTION

CROSS-REFERENCE TO PRIOR APPLICATIONS

This application is a Continuation of application Ser. No. 15/350,191, filed on Nov. 14, 2016, which is a continuation of U.S. patent Ser. No. 14/090,582 filed Nov. 26, 2013, which is a continuation of U.S. patent Ser. No. 13/022,944 filed Feb. 8, 2011, which claims the benefit of U.S. Patent Application No. 61/302,349, filed on Feb. 8, 2010. These applications are hereby incorporated by reference herein.

FIELD OF THE INVENTION

The present invention relates to power loss accounting for a contactless power supply system.

BACKGROUND OF THE INVENTION

It is becoming more common for contactless power to be transmitted to portable electronic devices, for example by utilizing inductive coupling. Many inductive power supply systems suitable for powering portable devices include two main components: (1) an inductive power supply or primary unit having at least one primary coil, through which it drives an alternating current, creating a time-varying electromagnetic field, and (2) a portable electronic device or secondary device, separable from the primary unit, including a secondary coil, which when placed in proximity to the time-varying field, the field induces an alternating current in the secondary coil, thereby transferring power from the primary unit to the secondary unit.

Contactless power supply systems are not 100% efficient. That is, some energy is lost in order to transfer power from the primary unit to the secondary unit. For example, some losses may be caused by the switching circuit components and other losses may be caused by the primary coil, sometimes referred to as ohmic losses, which are proportional to the ohmic resistance in the components and to the square of the current running through them. Foreign objects, and especially metal foreign objects, can also affect efficiency and in some cases cause a safety concern. Metal placed in the field is sometimes referred to as parasitic metal. Some parasitic metal in the field may be acceptable, for example, many portable devices, even ones powered by contactless power supply systems, sometimes include metal. The acceptable metal is sometimes referred to as known or friendly parasitic metal.

Some systems and techniques have been developed to attempt to detect whether there is an unacceptable amount of parasitic metal in the field. One basic system includes a power consumption detector in the electric circuit of a power sending terminal. When a piece of metal is placed on the power sending terminal instead of a portable device, the amount of consumed power at the power sending terminal increases abnormally. In order to prevent this abnormality, the power consumption detector measures the amount of power consumed by the power sending terminal. When the measured amount of the consumed power reaches a predetermined upper threshold, it is determined that there is an unusual situation and transmission of power is suppressed. Although a system such as this provides basic parasitic metal detection, it has flaws. For example, the system cannot account for (1) friendly parasitic metal, (2) portable devices that consume different amounts of power, or (3) power losses due to the misalignment of the power sending terminal and the portable device.

Other parasitic metal detection techniques have also been developed. For example, some systems can account for (1) the power being supplied to the actual load of the secondary device, (2) the friendly parasitics of the secondary device, (3) situations where there is not a simple 1:1 relationship between the primary unit and the secondary device, or (4) situations where presence of the secondary device does not necessarily physically exclude all foreign objects. Some of these techniques involve disconnecting the secondary load or communicating information from the secondary device to the primary unit. A number of these techniques are described in U.S. Patent Publication 2007/0228833 to Stevens, filed on May 11, 2005 entitled "Controlling Inductive Power Transfer Systems" which is herein incorporated by reference in its entirety.

Although some previous systems can provide parasitic metal detection, in some situations these systems can be inadequate. For example, known systems do not account for the known losses accurately enough and therefore incur too many false positives that result in a system restriction or shut down. To put it another way, one issue with some known parasitic metal detection systems is that their resolution is loose enough that a piece of metal could heat up to an undesired level. Utilizing a method that has an improved resolution or accuracy to detect losses can address this and other issues.

SUMMARY OF THE INVENTION

The present invention provides a contactless power supply system including a primary unit and a secondary device in which parasitic metal in proximity to the primary unit can be more accurately detected by accounting for changes in known power losses during operation. The amount of power loss during inductive power supply transfer in an inductive power supply system can vary depending on the alignment of the primary unit and the secondary device. Further, the amount of power loss during inductive power supply transfer can also vary as a function of changes in the operating frequency of the switching circuit in the primary unit or as a function of changes in the secondary device load. By accounting for changes in known power losses during operating, a more accurate determination of the amount of unknown power loss can be made. Further, the secondary measurements and primary measurements can be synchronized to increase accuracy. The more accurate the determination of unknown power losses, the more false positive parasitic metal detections that can be avoided. Further, the sooner (both in time and power threshold) a true positive can be detected.

In one embodiment, the present invention provides a contactless power supply system in which parasitic metal can be detected by comparing an expected input to a measured input. In the current embodiment, the expected input is determined as a function of various known losses in the system, including losses due to the misalignment of the primary unit and the secondary unit. The expected input does not account for any parasitic metal in the field, so if there is parasitic metal in the field, the expected input will be different from the measured input.

In one embodiment, a system and method for controlling a contactless power transfer system is provided. The contactless power supply system includes a primary unit with switching circuitry and a tank circuit operable to generate an electromagnetic field and at least one secondary device, separable from the primary unit, and adapted to couple with the field when the secondary device is in proximity to the primary unit so that power can be received inductively by the secondary device from the primary unit without direct electrical contacts. The primary unit includes among other circuitry, a controller, an input measurement unit located before the switching circuitry and a tank measurement unit located after the switching circuitry. The portable device includes among other circuitry, a secondary measurement unit and a controller. From time to time, measurements are transmitted from the secondary device to the contactless power supply where they are used by the controller together with measurements from the coil measurement unit to determine an expected input. The primary and secondary measurements can be synchronized, for example by accounting for the time it takes to take and send the measurement, time stamping the measurements, or utilizing a weighted average or other synchronization technique. The expected input is compared to the actual input to determine the amount of parasitic metal present in the field. The contactless power supply system can take a variety of actions in response to the detection of parasitic metal, for example restricting or stopping the supply of contactless power.

It can be difficult to distinguish between losses resulting in increased ohmic losses due to misalignment and losses due to parasitic metal in the field. This is generally because the input current is typically affected by both. However, losses resulting from a reduction in coupling and losses due to parasitic metal do not affect the primary coil current in the same manner. Leveraging this difference, a prediction function including both a characteristic of input power and a characteristic of primary unit coil power can determine whether or not there is a foreign object present in proximity to the primary unit. One advantage of the present invention is that it can distinguish between losses due to coupling and losses due to parasitic metal, making it possible to avoid false positives of parasitic metal detection in some situations.

These and other features of the invention will be more fully understood and appreciated by reference to the description of the embodiments and the drawings.

Figure 1:
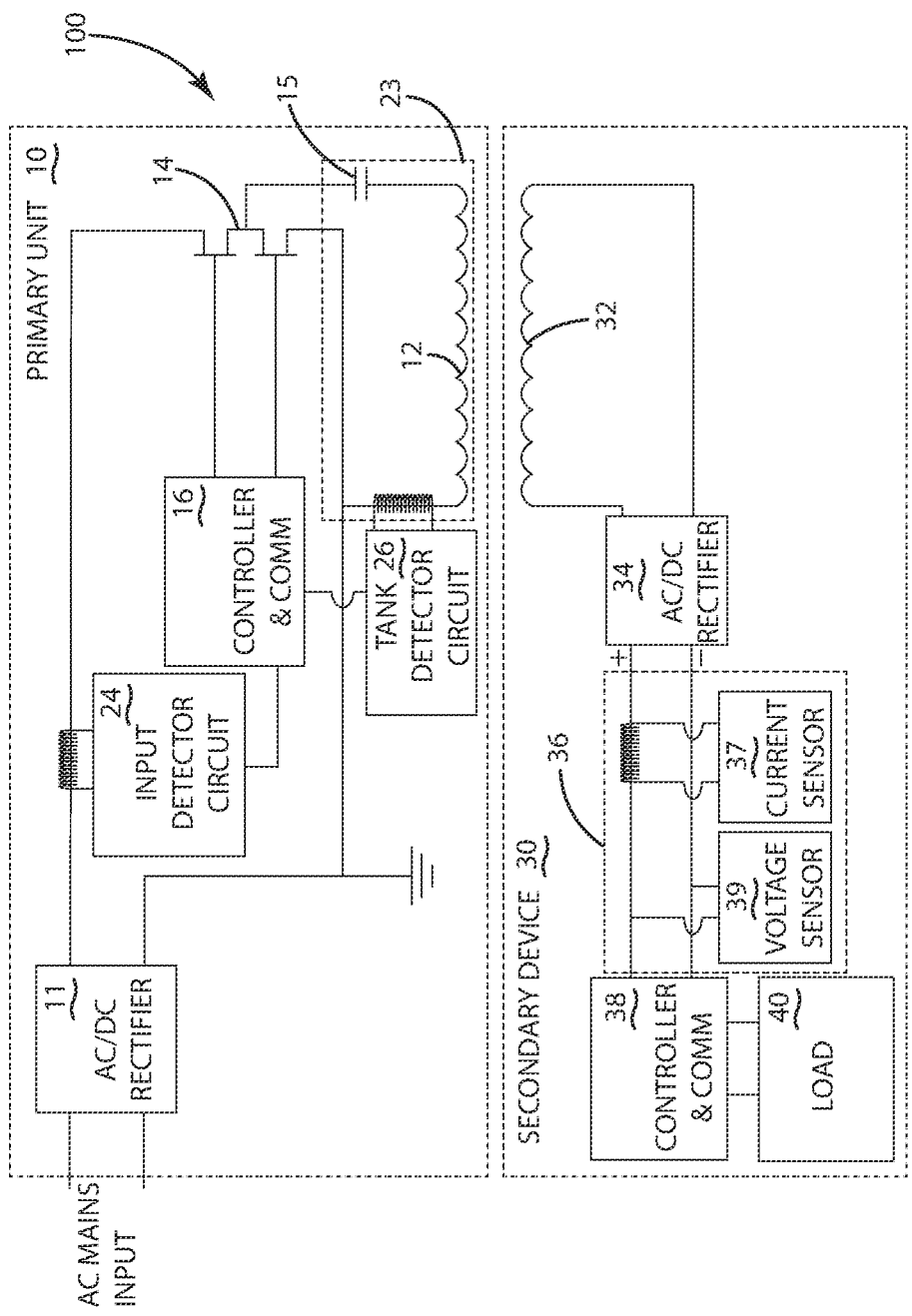
FIG. 1 illustrates one embodiment of a block diagram of a contactless power supply system capable of input parasitic metal detection.

Before the embodiments of the invention are explained in detail, it is to be understood that the invention is not limited in its application to the details of construction and the arrangement of the components set forth in the following description or illustrated in the drawings. The invention is capable of other embodiments and of being practiced or being carried out in various ways. Also, it is to be understood that the phraseology and terminology used herein are for the purpose of description and should not be regarded as limiting. The use of "including" and "comprising" and variations thereof is meant to encompass the items listed thereafter and equivalents thereof as well as additional items and equivalents thereof.

DESCRIPTION OF CURRENT EMBODIMENTS

The present invention is directed to systems and methods for accounting for power loss in the system and understanding whether unaccounted for losses are detrimental to operation. For example, their may be parasitic metal, a damaged component, or something else in the electromagnetic field causing power loss. In one embodiment, primary coil current, secondary current, and secondary voltage are utilized to determine an expected primary input current. When the expected primary input current is properly determined, it can be compared to the measured primary input current in order to detect whether and in some embodiments, how much, unaccounted power loss is present.

Input current varies with the power lost or consumed in the contactless power supply system. For example, the input current is affected by parasitic metal losses, the amount of power delivered to the load, primary and secondary rectification losses, primary switching losses, losses in the tank circuit, losses due to equivalent series resistance of any resonating capacitor, losses due to poor coupling caused by misalignment of the portable device and the contactless power supply, as well as other losses in the system. Measurements of the primary coil current, secondary current from the rectifier, and secondary voltage from the rectifier to ground may be utilized along with other information to estimate the various losses in the system that are not due to parasitic metal. Then, if the expected primary input current does not match the measured input current, the system knows there is an unexpected power loss and can conclude that there is a damaged component, parasitic metal or something else in the field causing the power loss. A parasitic metal or a damaged capacitor, coil, or field effect transistor can be damaged in such a way that it heats up. In some embodiments, the expected primary input current may account for friendly parasitics, and in other embodiments it may not. In alternative embodiments, other characteristics of power may be measured in order to accurately estimate the expected input current or to estimate a different expected characteristic of input power that will be useful in parasitic metal detection.

It can be difficult to determine whether certain power losses are due to misalignment or parasitic metal because it may be difficult to distinguish whether changes in input current are due to parasitic metal being placed in the field or increased losses as a result of a change in alignment between the primary unit and secondary device. The input current may stay relatively the same because the coupling changed simultaneously as parasitic metal was added to the field. For example, the secondary device could be nudged out of alignment by a user throwing their keys next to the secondary device. The parasitic metal in the keys may counteract some or all of the input current change that would have been caused by the misalignment. The contactless power supply system is not typically aware of the particular alignment between the primary unit 10 and the secondary device 30. Instead, the system calculates power loss by comparing the amount of power transmitted to the amount of power received, and subtracting the known acceptable losses. By utilizing coil current, additional known acceptable losses due to misalignment can be accounted for.

When there are losses due to parasitic metal in the field, the relationship between input power and expected power is different from the relationship between input power and expected power when the primary unit and secondary unit are misaligned. That is, the relationship between input power and expected power due to misalignment can be captured in a formula, so that if that when measured, if the measured data does not fit that formula a determination can be made that there is additional unknown power loss, for example due to parasitic metal. This can be true for characteristics of input power and expected power as well. For example, when there are losses due to parasitic metal in the field, the relationship between input current and coil current is different from the relationship between input current and coil current when there are losses due to poor coupling. Accordingly, by determining the expected input current as a function of the coil current, the accuracy of the parasitic metal detection can be increased. In the current embodiment, losses due to poor coupling were estimated by performing a best-fit analysis of data that was captured by taking measurements as the coupling between the primary unit and secondary device was changed. In alternative embodiments, the losses due to poor coupling may be calculated instead of estimated. For example, where the relative position of the primary unit and the secondary device is known, it may be possible to calculate the power loss due to misalignment. It is worth noting that in some systems, in response to misalignment, the primary unit may increase its power, such as by increasing the primary current, with respect to a given load current, this can cause losses dependent on primary coil current to increase. This can include primary electrical losses, coil losses, primary and secondary magnetic losses, and friendly parasitic losses. These changes in losses due to changes in power level can be accounted for in a formula that maps the relationship. In addition, when the alignment changes, the position of not only the secondary coil with respect to the primary coil changes, but also the position of any friendly parasitic metal on the secondary device changes. As the amount of electromagnetic field that intersects secondary shielding or other friendly parasitics changes, the amount of friendly parasitic power loss also changes. All of these changes due to increased power, changes in alignment, changes in frequency can be accounted for during the calibration method.

FIG. 1 illustrates parts of an inductive power transfer system embodying one embodiment of the present invention. The system 100 includes a primary unit 10 and at least one secondary device 30. The inductive power transfer system may have a number of suitable configurations. One suitable configuration is a power transfer surface where one or more secondary devices 30 can be placed.

Still referring to FIG. 1, the primary unit 10 is capable of generating wireless power for transmission to one or more secondary devices. The primary unit 10 generally can include an AC/DC rectifier 11, a controller 16, a switching circuit 14, a tank circuit 23, an input detector circuit 24, and a tank detector circuit 26. In this embodiment, the tank circuit 23 includes a primary coil 12 and a capacitor 15; however, the configuration of the tank circuit 23 may vary from application to application. The primary coil 12 may be a coil of wire or essentially any other inductor capable of generating an electromagnetic field that can be received by another inductor. In embodiments that are powered by AC Mains, power from the AC Mains is rectified by the AC/DC rectifier 11 and used to provide power to various circuitry in the primary unit and, in conjunction with the controller 16 and the switching circuitry 14, to generate alternating current in the tank circuit 23. Although not shown, the primary unit 10 may also include a DC-DC converter in those embodiments where conversion is desired. Alternatively, the system may not be connected to AC Mains. For example, in one embodiment, the system can accept straight DC input with no converter. The controller 16 is configured to control the timing of the switching circuitry 14 to create the alternating current in the tank circuit 23. In some embodiments, the timing of the switching circuitry 14 may be controlled to vary the operating frequency of the switching circuit at least in part on the basis of feedback from the secondary device 30. The controller 16 may include communication circuitry to enable communication with the secondary device 30. The controller 16 may communicate by utilizing the inductive coupling, for example by using a backscatter modulation scheme, or by an external communication path such as an RF transceiver.

The control unit 16 includes a microprocessor in the current embodiment. The microprocessor has an inbuilt digital-to-analogue converter (not shown) to drive the output to the switching circuit 14. Alternatively, an ASIC could be used to implement the control unit 16, as well as some or all of the other circuit elements of the primary unit. Although for simplicity the communication circuitry is shown in conjunction with the controller block, it should be understood that the communication circuitry could be separate from the controller circuitry. Further, the communication circuitry can utilize the primary coil for communication, or a separate communication path, such as an RF transceiver.

In one embodiment, the system can include a calibration unit. For example, the primary unit 10 may include a calibration unit in the controller 16, or located elsewhere in the system. Calibration numbers or coefficients can be stored both on the primary side in the controller 16 and on the secondary side when power transfer between a particular primary unit and secondary unit, the calibration data can be combined together in a formula in order to predict whether there are any unaccounted for losses during operation, such as parasitic metal in the field.

The calibration unit can store information about the losses in the system, for example the losses in the primary unit, secondary unit, or the coupling between the two. By design, at manufacture, and/or periodically thereafter, the losses in the primary unit may be calibrated and stored within the calibration unit. The calibration unit supplies the stored information to the control unit 16 to enable the control unit 16 to use the information in determining whether there is parasitic metal in the field. This calibration unit may vary the compensation information to cope with variable losses in the primary unit. The calibration unit may contain data related to the electrical and magnetic losses between the primary and secondary. For example, the calibration unit may contain data derived from a best-fit analysis of sweeping the secondary device through a range of different positions on the primary unit. This best-fit can be distilled into coefficients for a formula to determine an expected input current. For example, in one embodiment, the formula for expected input current is:

$$\text{Expected Primary Input Current} = 0.5 * i_{sec} + (0.052 * i_{sec} * V_{sec}) + (0.018 * i_{coil}) - 0.009$$

The Expected Primary Input Current is determined by utilizing a number of different terms that represent various losses in the system. For example, in this embodiment, the $0.5 * i_{sec}$ term accounts for the secondary rectification losses, the $(0.052 * i_{sec} * V_{sec})$ term accounts for the power delivered to the load, and the $(0.018 * i_{coil})$ term accounts for the power lost in the tank circuit, and the 0.009 term is an offset value.

The $i_{sec}$ and $V_{sec}$ values in the current embodiment are respective measurements of the instantaneous current and voltage after the secondary AC/DC rectification or the average current and voltage over a similar predetermined length of time. The $i_{coil}$ value in this embodiment is a measurement of the peak current in the primary coil. Alternatively, the $i_{coil}$ value could be RMS, peak to peak, or a combination (i.e. crest factor, or a voltage measurement could be used instead. All three of these measurements are synchronized in the current embodiment in order to determine an expected input current at a particular time. The various coefficients were derived based on data collected utilizing external current and voltage readings. In particular, the coefficients were selected based on a best-fit analysis based on data of voltage and current readings as the coupling was changed between the primary and secondary by changing the alignment. In the current embodiment, the expected input current was valid for secondary bridge voltages of 17V-24V and power ranging from 0-60 watts. The coil drive voltage was assumed to be 19V.

In general, the expected primary input current formula is able to account for coupling losses because the primary coil current varies with coil to coil spacing. The coefficients help to track the coil current as the x and z spacing changes. That is, the coefficients help to track the coil current as the coils become more horizontally offset, vertically offset, and more or less parallel. Essentially, when coupling gets worse, the input current goes up and coil current goes up, but when parasitic metal is placed in the field input current goes up, but coil current may not go up as much. Put another way, when coupling gets worse, the relationship between input current and coil current or between input power and expected power or between a characteristic of input power and a characteristic of expected power follows the expected relationship. But when parasitic metal is added to the field, the relationship between input current and coil current deviates from that expected relationship. In some embodiments, some or all of the coefficients or information that may be used to derive the coefficients may be transmitted from the secondary device to the primary unit. Transmission of this data allows the primary unit to be forward compatible for devices that may come out in the future, where different coefficients are appropriate.

The primary unit 10 in the FIG. 1 system includes an input detector circuit 24 connected to the control unit 16. The input detector circuit 24 performs a measurement of a characteristic of the electrical power drawn by the switching circuit 14, in response to a signal provided by the control unit 16 or an internal clock signal. The input detector circuit 24 provides an output representative of a characteristic of the electrical power drawn by the switching circuitry 14 to the control unit 16. The input detector circuit 24 in the current embodiment is an instantaneous current sensor that is capable of sensing the input current. In general, the input detector circuit 24 may be located anywhere in the primary unit before the switching circuitry 14. In alternative embodiments, the input detector circuit may include essentially any sensor or sensors capable of measuring one or more characteristics of the input power, which can be utilized to determine the input power or to determine whether parasitic metal is present in the field or another unexpected loss has occurred. The input detector circuit communicates its output with the primary controller 16. The input detector circuit output may be time stamped and buffered in the input detector circuit 24, the controller 16, or elsewhere in the primary unit 10, to assist with synchronization of other measurements, where appropriate. Additionally, the output can be smoothed or have a configurable weighted average applied. In one embodiment there may be gaps in the data, because the processor is unable to take a sample, so those terms can be weighted with zero or a negligible weight. In some embodiments, the secondary device may provide synchronization information or a synchronization standard may be preprogrammed into the primary unit that describes how or when the secondary device is sampling data, so that the primary unit can synchronize its measurements. For example, the secondary device may not time stamp its data, but rather provide a measurement to the primary unit with an expectation that the data was sampled at a particular time with respect to when it was received.

The primary unit 10 in the FIG. 1 system includes a tank detector circuit 26 connected to the control unit 16. The tank detector circuit 26 performs a measurement of a characteristic of the electrical power drawn by the tank circuit 23, in response to a signal provided by the control unit 16 or an internal clock signal. The tank detector circuit 26 provides an output representative of a characteristic of the electrical power drawn by the tank circuit 23 to the control unit 16. The tank detector circuit 26 in the current embodiment is a peak current detector. In general, the tank detector circuit 26 may be located anywhere after the switching circuit 14, including the input to the tank circuit 23, between the primary coil 12 and capacitor 15 of the tank circuit 23, or after the tank circuit 23. In other embodiments, the tank detector circuit 26 may include essentially any sensor or sensors capable of measuring one or more characteristics of the tank circuit power, which can be utilized to determine the tank circuit power or to determine whether parasitic metal is present in the field. The tank circuit detector 26 communicates its output with the primary controller 16. The tank detector circuit output may be time stamped and buffered in the tank detector circuit 24, the controller 16, or elsewhere in the primary unit 10, to assist with synchronization of other measurements, where appropriate.

The secondary device 30 is separable from the primary unit 10 and has a secondary coil 32 which couples with the electromagnetic field generated by the primary unit 10 when the secondary device 30 is in proximity to the primary unit 10. In this way, power can be transferred inductively from the primary unit 10 to the secondary device 30 without direct electrical conductive contacts.

FIG. 1 shows one embodiment of a secondary device 30 capable of receiving contactless power from the primary unit 10. As it relates to the reception of contactless power, the secondary device 30 generally includes a secondary coil 32, a rectifier 34, a secondary detection circuit 36, a controller 38, and a load 40. The secondary coil 32 may be a coil of wire or essentially any other inductor capable of generating electrical power in response to the varying electromagnetic field generated by the primary unit 10. The rectifier 34 converts the AC power into DC power. Although not shown, the device 30 may also include a DC-DC converter in those embodiments where conversion is desired. The controller 38 is configured to apply the rectified power to the load 40. In this embodiment, load 40 represents the electronics of the device 30. In some applications, the load 40 may include a battery or other power management circuitry capable of managing the supply of power to the electronics of the device 30. In alternative embodiments, the controller 38 may include power management circuitry. The controller 38 may include communication circuitry to enable communication with the primary unit 10. The controller 38 may communicate by utilizing the inductive coupling, for example by using a backscatter modulation scheme, or by an external communication path such as an RF transceiver.

The secondary device 30 in the FIG. 1 system includes a secondary detector circuit 36 connected to the control unit 38. The secondary detector circuit 36 performs a measurement of a characteristic of the electrical power delivered to the load 40, in response to a signal provided by the control unit 38 or an internal clock signal. The secondary detector circuit 36 provides an output representative of a characteristic of the electrical power delivered to the load 40 to the control unit 38. The secondary detector circuit 36 in the current embodiment includes both an instantaneous current sensor and an instantaneous voltage sensor. In general, the secondary detection circuit 36 may be located anywhere after the AC/DC rectifier 34 in the secondary device. In other embodiments, the secondary detector circuit 26 may include essentially any sensor or sensors capable of measuring one or more characteristics of the power delivered to the load, which can be utilized to determine the power delivered to the load. The secondary detector 36 communicates its output with the secondary controller 38. The secondary detector circuit output may be time stamped and buffered in the secondary detector circuit 36, the controller 38, or elsewhere in the secondary unit 10, to assist with synchronization of other measurements, where appropriate.

The input detector circuit 24, tank detector circuit 26, and secondary detector circuit 36 (referred to collectively as detector circuits) may include amplifiers arranged to produce an output signal that is directly proportional to the current in the input power. The detector circuits may also includes band-pass circuitry for removing variation in the output signal. The detector circuits may also include an amplifier for amplifying the filtered signal. The detector circuits may also include a comparator for converting the amplifier output to a high or low signal. The various detector circuits, whether they are voltage sensors or current sensors are generally conventional and can be essentially any type of sensor that obtains the desired measurement. For example, in some embodiments, the current sensors are current sense transformers. Alternatively, they could be shunt resistors, integrated sensors based on the hall effect, or any other device that transduces current into a voltage measurable by a microcontroller. In one embodiment, the detectors could be resistor/capacitor voltage dividers.

There are a number of circumstances under which the primary unit may restrict or stop the inductive power supply from the primary unit. Some of those conditions include detection of a substantial parasitic load in the vicinity of the primary unit, no secondary device 30 of the system is present in the vicinity of the primary unit 10, a secondary device 30 is present but does not currently require power. A load does not require power, for example, when turned off or when, in the case of a rechargeable battery or cell, the battery or cell is fully charged.

In one embodiment, a substantial parasitic load is found where the expected input current differs from the measured input current by 100 mA. The tolerance for parasitic metal can be changed by altering the threshold difference between expected input current and measured input current. A higher threshold indicates a higher level of tolerance of parasitic metal in the field, and a lower threshold indicates a lower level of tolerance of parasitic metal in the field. In the current embodiment, the 100 mA threshold was selected to ensure that if more than 1.9 Watts is dissipated into parasitic metal then the system restricts or stops inductive power supply.

In other embodiments, the friendly parasitics could be used in the calculation of expected input current and then would not be a factor in determining whether parasitic metal is present. In alternative embodiments that consider friendly parasitics in the expected input current calculation, the criteria for declaring a substantial parasitic load may be different.

Figure 2:
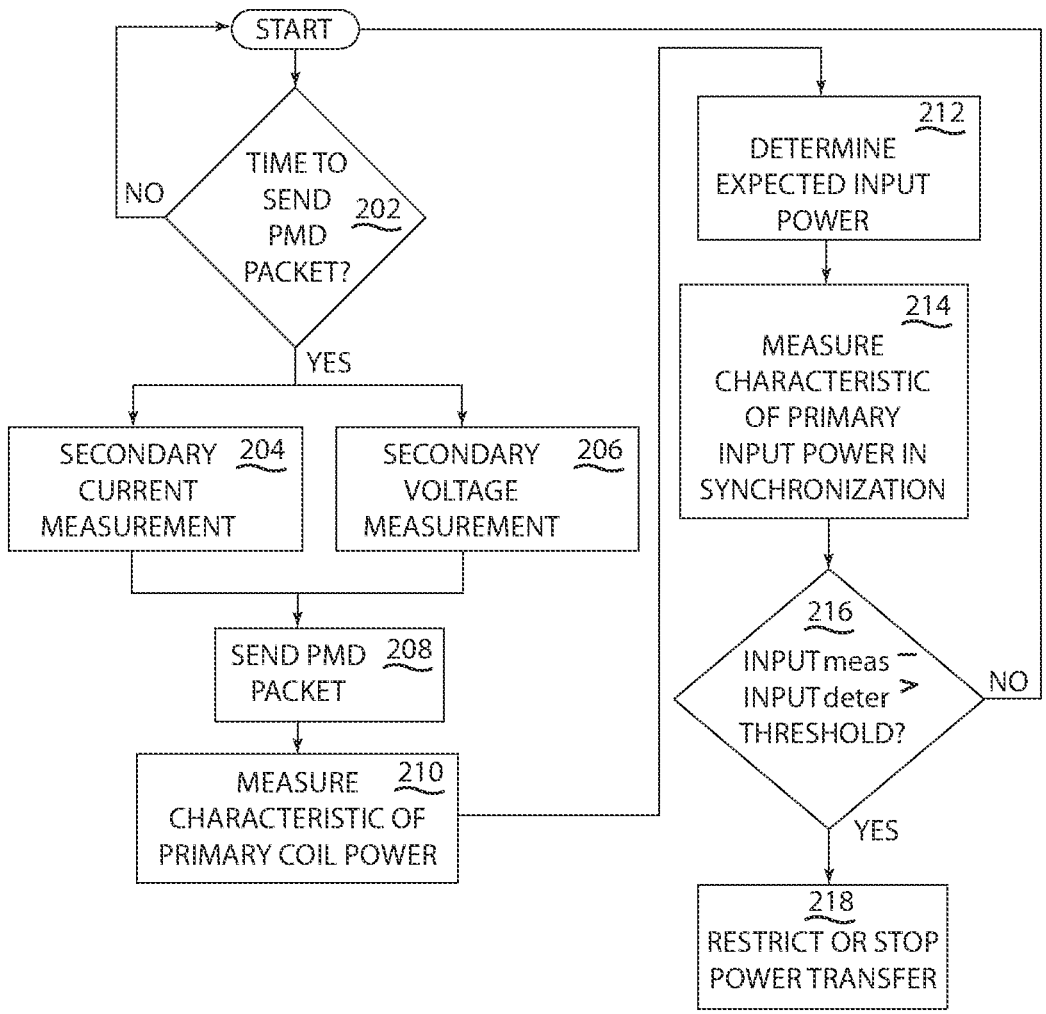
FIG. 2 illustrates one embodiment of a method of input parasitic metal detection.

FIG. 2 is a flowchart for use in explaining a method for detecting the presence of a substantial parasitic load in the vicinity of the primary unit in accordance with the present invention.

In the current embodiment, from time to time the secondary device sends a parasitic metal detection packet (PMD packet herein) to the primary unit so that the primary unit can determine whether there is any parasitic metal in the field. In the current embodiment, a PMD packet is sent to the primary unit every 250 ms. In alternative embodiments, PMD packets may be sent more or less frequently, or upon request from the primary unit, or essentially in any other scenario where it is appropriate to determine whether there is parasitic metal in the field generated by the primary unit.

When it is time to send a PMD Packet 202, the secondary detection circuit 36 initiates a voltage measurement and a current measurement after the AC/DC rectification, alternatively a power measurement could be taken using a different sensor system. In alternative embodiments, different measurements at different positions within the secondary device may be taken instead of or in addition to these measurements.

Any measurements for the PMD packet are assembled into the payload of the packet, along with any other information that may be useful for the parasitic metal detection in the primary unit. For example, the PMD packet may include time stamp information, indicating the time at which the measurements were taken, for synchronization purposes. In addition, the PMD packet may include information about missing data points or if there has been any smoothing, averaging, or other weighting function. The PMD packet may also include identifying information about the device, for example so that various information could be looked up in a look-up table stored on the primary unit. For example, some primary units may include a table of friendly parasitics associated with various secondary devices. In some other embodiments, the secondary device may communicate its friendly parasitics directly. Although described in the context of a PMD packet, it should be understood that the format in which the information is sent to the primary unit is unimportant, non-packet communication techniques are also viable. In the current embodiment, the packet contains a 3 byte payload (5 bytes total) including two 10 bit variables with the most significant bits from both variables sharing the last byte. In the current embodiment, the PMD packet does not include any timestamp information, but instead the primary unit synchronizes by assuming there was a 9 ms delay from the time it receives the PMD packet to when the secondary measurements were taken.

Once the PMD packet is assembled, it is sent to the primary unit 208. Upon receipt of the PMD packet, the primary unit in the current embodiment obtains the primary coil current measurement that is stored in a buffer that corresponds to the 9 ms before the PMD packet was received. This fixed 9 ms delay accounts for the latency in sending the PMD packet and ensures that the measurements on the primary and secondary side are synchronized.

The primary unit controller determines the expected input current utilizing the information received from the secondary device and the appropriate measurements from the primary unit 212. As described above, this determination may be performed based on a pre-defined formula that accounts for a number of different losses in the system with a best-fit analysis.

The primary unit also measures the primary input current at the synchronization time 214. Like the coil current, the primary input current may be kept in a buffer to assist with synchronization.

The primary measured input current is compared to the primary expected or calculated input current to determine whether there is any parasitic metal in the field 216. The difference between the measured input current and the determined input current represent any unaccounted for losses in the system. In the current embodiment, the numbers may be simply subtracted and if the difference is greater than a threshold, then the system determines that there is a significant amount of parasitic metal in the field and the contactless power supply may take a number of different actions. For example, the system may shut down, lower output power, or turn on warning lights 218. If the difference is less than the threshold, then the system determines that there is not a significant amount of parasitic metal in the field and the system either does nothing or indicates that no parasitic metal is present. The system may then wait until it is time to send another PMD packet.

In one embodiment, if parasitic metal is detected, the primary unit will remain in the shutdown mode until it is reset in some way. Such a reset could be manually initiated by a user of the primary unit, or alternatively the control unit 16 could periodically start to supply inductive power again and repeat the parasitic metal detection to determine whether to remain in the shutdown mode or not.

The parasitic metal detection techniques described above in connection with FIG. 2 may be supplemented by other, different parasitic metal detection techniques. For example, some parasitic metal detection is more reliable where the secondary loads can be periodically disconnected and the system is allowed to be observed in a ring down state. In order to perform a ringdown parasitic metal detection, all of the secondary devices in the vicinity of the primary unit are deliberately set to a no-load state. In this no-load state, supply of any of the power received inductively by the secondary device to an actual load thereof is prevented. This allows the system to obtain information about the parasitic metal in the field without having to consider the secondary device load. The ability to combine ringdown parasitic metal detection with input power parasitic metal detection allows for more accurate parasitic metal detection under some circumstances.

In one embodiment of ringdown, there is an open secondary circuit where the coil has its own inductance value and equivalent series resistance. This means it will respond in knowable ways to a variety of stimuli. If an impulse is provided, the voltage in the resulting R (ESR) L (Coil) C (tank cap) circuit while decay with a well known time constant. If it decays quicker, it means that either L went down, or ESR went up, which suggests parasitic metal. If we instead turn the coil on at a certain frequency, again the RLC circuit should have a predictable voltage or current. Again, parasitic metal will shift the response away from the expected (higher current, lower voltage, etc).

Figure 3:
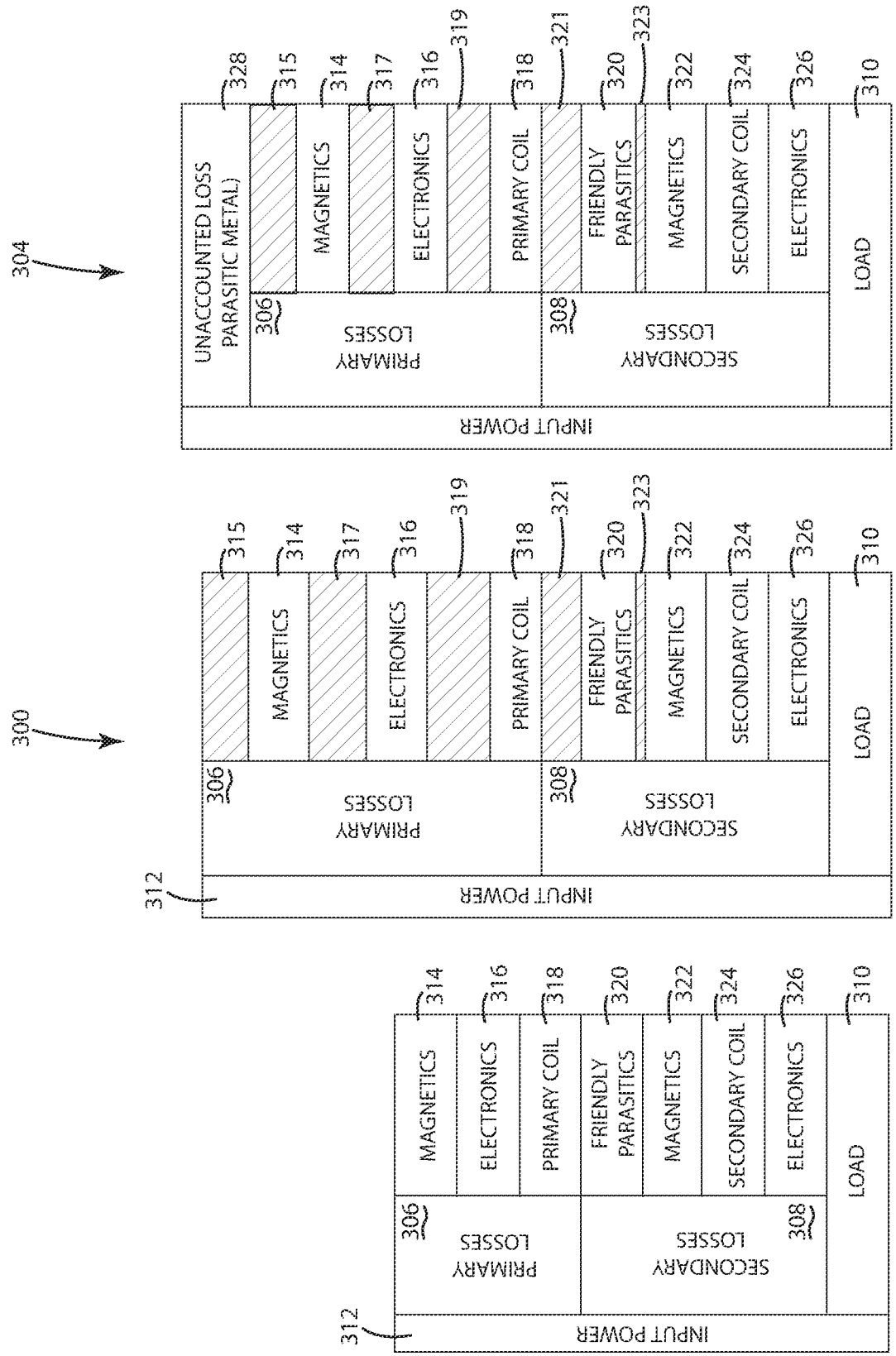
FIG. 3 is a diagram showing a representative graphs of input power and power consumption in a variety of different scenarios.

FIG. 3 shows three representative scenarios 300, 302, 304 of the relationship between input power and power consumed in a contactless power supply system. In the first scenario 300, the primary unit and the secondary device are aligned and there is no unfriendly parasitic metal present in the field. Put another way, there are no unaccounted for losses in the first scenario. In this scenario, the combined primary power losses 306, secondary power losses 308, and power consumed by the load 310 is equal to or substantially the same as the input power 312. In the current embodiment, the primary power losses 306 can include power loss to primary unit magnetics 314 (such as primary unit shielding losses), primary unit electronics 316 (such as rectification, switching, regulation, and filtering losses), and the primary coil 318 (such as $I^2R$ losses). In the current embodiment, the secondary power losses 308 include power losses to friendly parasitics 320 (such as parasitic metal in the secondary device losses), secondary magnetics 322 (such as secondary device shielding kisses), secondary coil 324 (such as $I^2R$ losses), and secondary electronics 326 (such as rectification, regulation, and filtering losses). When the known power consumption, including power used by the load and power losses in the system, is substantially the same as the input power, then there are no unaccounted for losses in the system, such as unknown parasitic metal.

In the second scenario 302, the primary unit and the secondary device are misaligned. When the secondary device is misaligned from the inductive power supply, the coupling decreases. This can lead to the primary delivering more power to the coil so as to deliver the same amount of power to the secondary. Because more power is delivered, in the current embodiment the losses increase. For example, there are more electronics losses in the primary ($I^2*R$, rectification if applicable, switching, operating frequency may have shifted), there is more power lost in the coil due to higher coil current, there is more power lost in the magnetics due to a larger field being generated by the primary coil, there is more power lost in the parasitics, both friendly and foreign due to a larger field, and in some circumstances secondary losses may increase if the operating frequency shifted, which could cause minor increases in losses in the secondary rectification and secondary coil. In some embodiments, the changes in these secondary losses can be ignored. In general, the power losses in the load and in the secondary (other than rectification and coil) does not change because it is still (trying) to draw the same amount of power. In the illustrated embodiment, additional input power 312 is provided (either by adjusting operating frequency, resonant frequency, duty cycle, rail voltage, or some other parameter) in order to deliver he same amount of power to the load 310 as in the first scenario (because the load has not changed). However, because the primary unit and the secondary device are misaligned, there may be additional primary unit losses 306 and secondary device losses 308. In the current embodiment, there are increased losses in primary unit magnetics 315, primary unit electronics 317, primary coil 319, secondary device friendly parasitics 321, and secondary device magnetics 323. In the current embodiment, the power loss in the secondary coil 324, secondary device electronics 326, and the load 310 remains constant. If the input power 312 is generally equal to the combined power losses 306, 308 and power consumed by the load 310, then there is no unknown power loss in the field such as unknown parasitic metal.

In the third scenario 304, the primary unit and the secondary device are aligned, but a piece of parasitic metal is placed in the field. Additional input power 312 is provided (either by adjusting operating frequency, resonant frequency, duty cycle, rail voltage, or some other parameter) in order to deliver the same amount of power to the load 310 as in the first and second scenario (because the load is the same in all three scenarios). However, because there is a piece of unknown parasitic metal in the field, there may be additional primary unit losses 306, additional secondary device losses 308, and some unaccounted for power loss 328. In the current embodiment, there are increased losses in primary unit magnetics 315, primary unit electronics 317, primary coil 319, secondary device friendly parasitics 321, and secondary device magnetics 323. In the current embodiment, the power loss in the secondary coil 324, secondary device electronics 326, and the load 310 remains constant. Because there is a significant difference between the input power 312 and the combined known power losses 306, 308 and power consumed by the load 310, the system can assume that there is an unknown power loss in the field, such as unknown parasitic metal. In response to detecting this unknown power loss the contactless power transfer system may restrict or stop power transfer.

The scenarios in FIG. 3 are not drawn to scale, and are merely provided as examples to assist in explanation. Further, the relative amounts of power loss and power use by the load shown in these three scenarios 300, 302, 304 are merely representative. In some embodiments, there may be additional or fewer types of power loss. For example, if the secondary device does not include any friendly parasitics, then there would not be any associated power loss. The various losses in FIG. 3 are exaggerated to illustrate how the system can tell the difference between misalignment between a primary unit and secondary device and parasitic metal being placed in the field. Merely comparing the amount of input power to the amount of power delivered to the load does not allow a system to distinguish between scenario two 302 and scenario three 304. Even if the system accounts for the various losses when the primary unit an secondary unit are aligned, unless the system accounts for changes in power loss that occur due to misalignment, there is the potential for a large amount of false positives due to misalignment. If the system can account for the changes in power loss during operation, such as misalignment, the system will incur fewer false positives.

As mentioned above, systems can have trouble distinguishing between power losses due to misalignment vs. power losses due to parasitic metal, or that do not have sufficient resolution can trigger false positives, resulting in restriction or halting of the contactless power supply to the secondary device. In the current embodiment, the expected input current or expected input power match the measured input current or expected input power because the formula accounts for the losses due to misalignment during operation.

In addition to having misalignment or parasitic metal added to the field, it is possible to have both simultaneously. For example, a user may accidentally throw his keys on to the charging surface, nudging the secondary device out of place. Under these circumstances, the losses due to parasitic metal and the losses due to misalignment both increase simultaneously. Because the system is looking for a relationship between input power and the known losses, the system can still identify that there is parasitic metal in the field.

In the current embodiment, the primary coil current, secondary current, and secondary voltage are plugged into a formula that was derived and coded into the controller at the time of manufacture. The formula is derived by considering known losses based on the fixed impedance and resistance values associated with the primary unit.

An alternative embodiment of a method of controlling inductive power transfer in an inductive power transfer system, such as the one described above in connection with FIG. 1, is described below. The inductive power transfer system 100 includes a primary unit 10 and a secondary device 30. The primary unit 10 includes a tank circuit 23 and a switching circuit 14, which together are operable to generate an electromagnetic field. The system also includes a secondary device 30 that is separable from the primary unit and adapted to couple with the field when the secondary device is in proximity to the primary unit so that power is received inductively by the secondary device from the primary unit without direct electrical conductive contacts therebetween.

In one embodiment, the switching circuit operates at an operating frequency that varies between a range of different operating frequencies during operation. In some embodiments, the operating frequency or some other parameter of the primary unit may be adjusted in response to a change in the load or a request from the load. For example, if the secondary device demands additional power, the primary unit may adjust the operating frequency, duty cycle, resonant frequency, or rail voltage to increase its power output. An example of one such primary unit is described in U.S. Pat. No. 7,212,414 to Baarman, filed on Oct. 20, 2003, and is herein incorporated by reference in its entirety. In addition to power loss changing due to misalignment of the primary unit and the secondary device, power loss may change as a function of the operating frequency of the switching circuit or the power demand of the load associated with the secondary device. For example a programmable electronic load may be utilized to test different currents at a constant voltage or different voltages at a constant current.

The method includes measuring a characteristic of input power in the primary unit, measuring a characteristic of power in the tank circuit of the primary unit, receiving, in the primary unit, information from the at least one secondary device, estimating power consumption in the inductive power transfer system as a function of at least the measured characteristic of power in the tank circuit of the primary unit, comparing the measured characteristic of input power in the primary unit, the information from the at least one secondary device, and the estimated power consumption to determine there is an unacceptable amount of parasitic metal present in proximity to the primary unit, and restricting or stopping the inductive power transfer from the primary unit in response to a determination that the unacceptable amount of parasitic metal is present in proximity to the primary unit.

Estimating the power consumed can include estimating the power loss in the inductive power transfer system, estimating power drawn by a load of the secondary device, or both. The estimation of power loss in the inductive power transfer system can be a function of the measured characteristic of power in the tank circuit of the primary unit and the information from the secondary device. For example, the power loss estimation may include estimating the primary unit magnetic hysteresis power loss, the primary unit magnetic eddy current power loss, the primary unit voltage power loss, the primary unit resistive power loss, and the secondary device power loss. Information regarding the secondary device power loss may be partially or entirely provided by the secondary device. For example, the information can be in the form of a secondary device ID, a measurement of a characteristic of power in the secondary device, an estimation of power loss in the secondary device, one or more power loss coefficients (including coefficients that characterize the magnetic hysteresis and magnetic eddy losses), or a combination thereof. The secondary device power loss can be described in terms of the secondary device eddy current power loss, secondary magnetic hysteresis loss, the secondary device voltage power loss, and the secondary device resistive power loss.

Additional sensors can be included on the primary unit and secondary unit to more accurately measure the various power losses in the system during operation. However, additional sensors can increase the cost and size of the primary unit and secondary device. Accordingly, in some embodiments, curve fitting analysis can be utilized to estimate the power losses based on experimental data. For example, in one embodiment, experimental data can be collected on various combinations of primary units, secondary devices, power loads, secondary device positions (including location and orientations), frequency, and friendly parasitics. The types of data that can be collected experimentally may include essentially any type of measurement. In one embodiment, the data collected may include input voltage, input current, input power calculations, primary coil voltage, primary coil current, transmit power calculations, secondary coil voltage, secondary coil current, received power calculations, output voltage, bridge voltage, output current. In alternative embodiments, additional, different, or fewer measurements or calculations may be collected. Any technique for taking the measurements can be utilized, including but not limited to average values, RMS values, power factor, crest factor, peak values, and phase between voltage/current.

In one embodiment, the measured characteristic of input power in the primary unit, information from the secondary device, and the estimated power consumption can be compared to determine there is an unacceptable amount of parasitic metal present in proximity to the primary unit or another unaccounted for power loss such as a malfunctioning component. This comparison can include a variety of different techniques in different embodiments. In one embodiment the comparison entails calculating the total power consumption based on the characteristic of input power in the primary unit, a characteristic of tank circuit power, operating frequency, and the information from the secondary device and determining that there is a foreign object present in proximity to the primary unit by detecting a difference between the calculated total power consumption and the estimated power consumption.

In one embodiment, a determination about whether there is an unacceptable amount of parasitic metal present in proximity to the primary unit can be made by taking the difference between the measured total power consumption and the measured power consumption and comparing that value to a threshold value. The threshold may be dynamic and based on the operating point of the system or on a variety of other factors. If the value exceeds the calculated threshold then there is an unacceptable amount of a parasitic metal, if it does not exceed the threshold then the amount of parasitic metal present is acceptable.

As described above, a best-fit analysis, sometimes referred to as curve fitting, can be performed by sweeping the secondary device through a range of different positions (locations and orientations) with respect to the primary unit. This curve fitting can be distilled into coefficients for a formula or a set of formulas to determine whether there is an unacceptable amount of parasitic metal in the field. One example of a set of formula for this is:

$$P_{Measured} = C_0 + (C_1+C_2) \cdot i_{tx\_coil} \cdot f + (C_3+C_4) \cdot (i_{tx\_coil} \cdot f)^2 + C_5 \cdot i_{tx\_input} + C_6 \cdot i_{tx\_coil}^2 + C_7 \cdot i_{rx\_rectified} + C_8 \cdot i_{rx\_rectified}^2 + C_{10}$$

$$P_{Calc} = Pin_{tx} - C_P \cdot P_{tx\_rectified}$$

$$P_{Foriegn} = P_{Calc} - P_{Measured}$$

Each of the coefficients can be determined experimentally. The coefficients can be determined individually based on the individual type of power loss through physical observation of components in the system, or a curve fit may be performed to obtain all of the coefficients simultaneously. In one embodiment, a brute force curve fit using known multivariate polynomial regression techniques or other methods of fitting observed data to a given formula may be utilized to determine the coefficients. These techniques are generally referred to as curve fitting. In another embodiment, the coefficients are determined experimentally by collecting data as a check for bench-measured parameters, such as equivalent series resistance and voltage drop. The data can be collected for a variety of different combination of primary units, secondary devices, loads, positions, friendly parasitics. Tx refers to the primary unit or transmitter, and Rx refers to the secondary device or receiver. The $i_{tx\_coil}$ refers to the primary unit coil current, $i_{tx\_input}$ input refers to the primary unit input power, and $i_{rx\_rectified}$ refers to the current after rectification in the secondary device. In the current embodiment, the coefficients are the same for all loads.

Although the current embodiment includes 10 coefficients, in alternative embodiments additional, different, or fewer coefficients may be utilized. For example, the C7 and C8 coefficients may be eliminated without significantly affecting the parasitic metal detection success rate. Further, although a set of formulas is provided above to help understand the approach, a single formula can be generated by substitution. The formula compares the input power, the output power, and the various losses in the system in order to determine if there is any parasitic metal in proximity of the primary unit. Tx refers to the primary unit or transmitter, and Rx refers to the secondary device or receiver. The $i_{tx\_coil}$ refers to the primary unit coil current, $i_{tx\_input}$ refers to the primary unit input power, and $i_{rx\_rectified}$ refers to the current after the rectifier in the secondary device, for example as shown in the current sensor of FIG. 1.

In one embodiment, the power loss estimation can be made more accurate by accounting for frequency variation. For example, some inductive power supplies vary the operating frequency of the switching circuit of the primary unit during operation. This change in operating frequency can have an effect on how much power loss there is in the system. In order to more accurately estimate the power loss in the system, for each operating frequency, an equivalent series resistance value of the primary coil can be determined. The data points of equivalent series resistances can be curve fit in order to determine an eddy current power loss coefficient for estimating primary unit eddy current power loss. That is, it can be difficult to calculate the eddy current power losses that occur for any given primary unit and secondary device at any given frequency. By determining experimentally what the eddy current power loss is for a combination of primary units and secondary devices at a plurality of frequencies, a generalized function of what losses to expect can be developed as a function of frequency. This same technique can be utilized for any power loss in the system that is dependent on frequency. That is, by collecting data on the different types of power losses that occur in various combinations of primary units and secondary devices at the various frequencies, if the power losses vary based on frequency, then curve fitting can help to develop a set of coefficients for a formula that can be used during operation in order to better estimate the power losses. All ten coefficients can be determined experimentally so that they can be stored in the primary unit or secondary device during manufacture. In general, primary parameters are hardcoded into the primary unit, while secondary device parameters are communicated during operation or during an initialization calibration routine. To be clear, this calibration routine can be a separate process from the calibration process described herein for determining the coefficients. Instead, this calibration routine can be utilized to ensure that the processing unit that ultimately determines the whether there is parasitic metal in the field has access to all of the appropriate coefficients.

The function can be based on classically known loss models for certain parts of the system. For example, magnetic materials have losses related to i*f that are due to hysteresis (C1 for primary material, C2 for secondary material), magnetic materials have losses related to (i*f)^2 that represent eddy current losses in those materials (C3 for pri, C4 for sec), capacitors, coils, and FETs have "resistive losses" that relate to i^2 (C6, C8), since the total power loss on the secondary can be approximated as a linear function of the received power, we can use a scalar function of received power (C9, C10) to approximate additional losses. Since we know that these are the physical loss models of all of these major circuit components, we can do a multivariate polynomial regression on all of our data collected to find what each of these coefficients might be. An alternative way to find the coefficients is to incrementally measure them in system and determine their values. This can then be verified against the observed (collected) data.

Referring to the formula above, C0 represents the primary unit offset, it can be utilized during the curve fitting process to represent all losses not dependent on current. As mentioned above, all coefficients, including C0, could be best-fit simultaneously (multivariate polynomial regression). Or, if determined experimentally by measuring values of ESR, voltage drop, etc, and C0 would be whatever is left over. This represents a base level of power that (what the micro uses, etc) that does not vary with load.

C1 and C2 are the coefficients that represent the primary unit and secondary device magnetic hysteresis losses in the system respectively. In some embodiments the coefficients for the magnetic hysteresis losses may be assumed to be zero or near zero and therefore be eliminated from the calculation. The primary unit and secondary device can be designed to minimize the hysteresis losses and thereby simply the calculation. If C3 and C4, as described below, are not constant versus frequency, then C1 an C2may be considered nonzero. When ESR is measured, an assumption is made of the I^2*R loss model. If it fits the function (I*f)^2*R, that means that when we measure ESR over many frequencies and divide by f^2, the resultants should be equal to each other (or very close) for all measurements of ESR. If they are not, then a different loss model is considered and a polynomial regression on (i*f) may be performed.

C3 and C4 represent the primary unit magnetics eddy current loss and the secondary unit magnetics eddy current loss respectively. In order to determine C3 and C4, the equivalent series resistance ("ESR") of the primary and secondary coils is measured, independent of any magnetic material. This is referred to as the bare coil ESR. The bare coil ESR can be measured over a range of frequencies, for example in the current embodiment the bare coil ESR is measured over a frequency range of 110 kHz to 205 kHz.

In order to determine C3, the equivalent series resistances ("ESR") of the primary coil, primary unit shield (if any), and primary unit magnet (if any) is measured. This is referred to as the bare coil assembly ESR. The bare coil ESR is subtracted from the primary coil assembly ESR in order to provide the ESR of just the primary unit shield and primary unit magnet, sometimes referred to as the primary magnetics ESR. Of course, these ESR values may be obtained in different ways other than the method of the current embodiment. In one embodiment, C3 is determined by dividing the primary magnetics ESR by the square of the frequency at which the measurement is taken. In an alternative embodiment, in order to increase the accuracy of C3, multiple measurements at different frequencies over the expected operating range can be taken. In that case, the primary magnetics ESR at each frequency is divided by the frequency squared and the average of all of those values is taken to account for experimental errors and is deemed to be C3.

In order to determine C4, the ESR of the system is measured. In the current embodiment, the system ESR is measured while the primary unit and the secondary device are aligned and when the system includes the primary coil, the primary unit shield, the primary unit magnet, the gap between the primary unit and the secondary device, the secondary device coil, the secondary device shield, the secondary device magnet, and any friendly parasitic metal. In the current embodiment, when the system ESR is measured, it is observed from the perspective of the primary coil. The primary unit assembly ESR (primary coil with magnet and primary shield present) is subtracted from the system ESR to obtain the secondary device assembly ESR. In one embodiment, C4 is determined by dividing the secondary device assembly ESR by the square of the frequency at which the measurement is taken. In an alternative embodiment, in order to increase the accuracy of C4, multiple measurements at different frequencies over the expected operating range can be taken. In that case, the secondary device assembly ESR at each frequency is divided by the frequency squared and the average of all of those values is taken to account for experimental errors and is deemed to be C4.

In one embodiment, C4 can be determined more accurately by also obtaining the secondary device assembly ESR at a variety of different alignments. That is, the secondary device may be moved around automatically in space, for example utilizing an X, Y, Z table or XYZ table with rotation to obtain ESR measurements at precise locations and orientations. In the current embodiment, all of the ESR/f^2 values for each combination of operating frequency and position can be averaged to obtain a C4 value for a particular secondary device, for example a mobile phone with a secondary coil for receiving an electromagnetic field, a magnetic shield, and friendly parasitics such as the housing, electronics, and battery.

Figure 4:
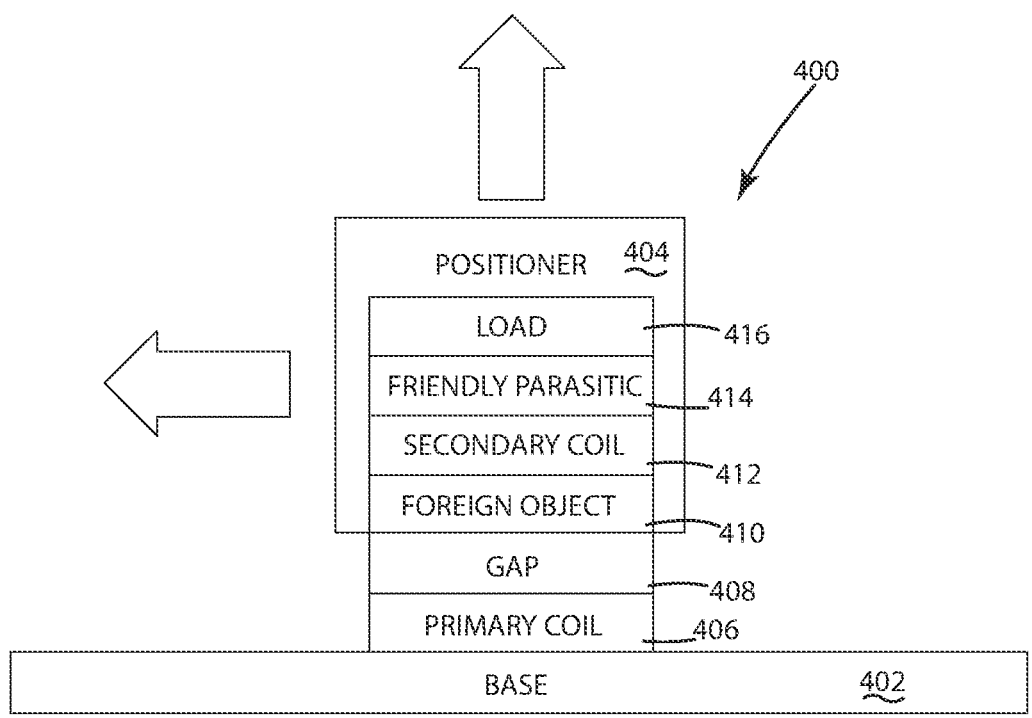
FIG. 4 is a representative diagram of a geometric positioning system for use in calibrating the input parasitic metal detection system.

One embodiment of a geometric positioning system is shown in FIG. 4, and designated 400. The geometric positioning system 400 can be used to move the relative position of the primary and secondary coil. In the current embodiment, the geometric positioning system 400 includes a base 402 and a positioner 404. The base 402 can be integrated with a primary unit or portion of a primary unit such as a primary coil 406, or in some embodiments a primary coil 406 or primary unit may be removably attachable to the base 402. A variable gap 408 may be provided by stacking various different size spacers that does not effect the inductive power transfer. Alternatively, the positioner 404 may provide precise x,y, and z positioning in space to provide the gap 408 instead of using a spacer. Foreign objects 410, secondary coils 412, friendly parasitics 414, and other items may be removably attached to the positioner 404. Because the current embodiment utilizes circular coils, the positioner 404 only provides movement in a single direction, by increasing the size of the spacer, the vertical position can be varied. In an alternative embodiment, a multi-axis table can be utilized to move the coils. Even with a single direction positioner, location of movement can be provided in the form of a triplet, the X and Y values are always the same, because movement is diagonal on the XY axis with respect to the primary coil. The Z component of the triplet is provided by the thickness of the gap 408.

Although one method of determining C3 and C4 is described above, other methods may also be employed. Any known technique can be utilized to solve or estimate C3 and C4 in the formula:

$$I_{tx}^2 * ESR_{tx\text{-}bare} + I_{rx}^2 * ESR_{rx\text{-}bare} + (C_3 + C_4) * (i_{tx} * f)^2 = \text{Input}_{power} - (TX_{power} + RX_{power} + \text{Foreign Object}_{power})$$

This formula should hold true for all loads in all positions.

Referring back to the generalized equation for determining whether there is an unacceptable amount of parasitic metal in the field, C5 and C6 represent the electronics losses on the primary unit. The primary unit losses can be calculated generally determined by subtracting the amount of power in the primary unit coil from the amount of input power. However, during operation, it can be expensive to include the hardware to take these power measurements. Further, in some embodiments, the primary unit electronics power losses can be accurately estimated utilizing some curve fit coefficients, primary unit input current, and primary unit coil current. In alternative embodiments, different measurements may be utilized to estimate the primary unit electronics losses. For example, in some embodiments, the losses can be fit to a second order equation based solely on the primary unit coil current. In that embodiment, C5 is a first order term and C6 is a second order term plus the primary unit bare coil ESR.

C7 and C8 represent losses in the secondary device rectifier. These losses can be curve fit to a second order polynomial equation of $P_{received} - P_{rectified} = C_7 * I_{rx\text{-}rect} + C_8 * i_{rx\text{-}rect}^2$.

In the current embodiment, for simplicity, the losses in the secondary device coil can be included in C8 by adding the secondary device bare coil ESR to C8. In alternative embodiments, the losses in the secondary device coil can be a separate term. It is worth noting that if a slope-intercept resistor network is utilized on the secondary device, C7 and C8 can be assumed to be zero and coefficients C9 and C10 would be used instead. In order to utilize the C7 and C8 terms in the current embodiment, a measurement during operation of the secondary coil current is necessary. By removing those terms, the calculation may still be sufficiently accurate, but the additional complexity in hardware design can be eliminated. Instead of C7 and C8, a C9 coefficient may be utilized to estimate the amount of secondary device power loss.

C9 and C10 can be calculated to together. In one embodiment, plotting Preceived-Pdelivered against load, allows a straight line through the curve to approximate loss to be drawn. The intercept is C10 and represents the secondary device power loss offset. C9 is 1+ the slope, since the C9 term also accounts for the power delivered to the load.

One embodiment of a method for calibrating an inductive power transfer system utilizing a calibration system is described below.

The calibration system may include test equipment for performing power tests and thermal tests. The power test equipment may include a geometric positioning system 400, 2 AC current probes, 2 DC current probes, and analog to digital converters having 10 Channels of 10 MHZ+12 bit+ sampling. The analog to digital converters can be located at various locations in the circuit for sampling fast enough and with enough resolution to determine desired information. The test equipment may include software that sweeps through a number of positions on the geometric positioning system and samples all of the data points. The data points can be sampled at a rate of 1 second, or some other rate. The raw data can be saved or in the alternative the raw data may be discarded once certain calculated values are obtained. The various values that can be recorded during the calibration were discussed above, suffice it to say the values can include various voltage, current, frequency, and phase measurements throughout the system. The thermal test equipment may be utilized to determine the threshold for the amount of acceptable parasitic metal.

In one embodiment of the method of calibration, different combinations of receiver coils, loads, friendly parasitics, locations, and transmitters can be tested. For example, a variety of different shapes and sizes of secondary coils that are designed for a particular amount of power may be calibrated. A variety of different loads, for example static loads of 0.2, 0.4, 0.6, 0.8, 1, 2, 3, 4, 5 W at each location can be tested. Alternatively or additionally, actual operational devices such as specific models of mobile phones or other secondary devices may be tested. Additionally, unloaded configurations can be tested. A variety of different friendly parasitics can be tested. For example, materials such as an aluminum plate, copper plate, stainless steel sheet, blue steel sheet, or the specific body of a mobile phone. In the current embodiment, each of the friendly parasitics are 25% bigger than the secondary coil, meaning that it extends past the edges of the secondary coil by 25% in each direction. A variety of different positions in space, or in separation and misalignment can be measured. In the current embodiment, the orientation is kept constant, but 5 different locations are measured. A variety of different primary units or primary coils within primary units can be tested.

The method of calibrating includes placing the secondary device in a plurality of different positions with respect to the primary unit, operating the primary unit at a plurality of different loads, for each position and load combination, determining an equivalent series resistance value of the secondary device, for each load operating frequency and load combination, determining an equivalent series resistance value of the primary unit, curve fitting the determined equivalent series resistance values of the secondary device to determine an secondary device eddy current power loss coefficient for estimating secondary device eddy current power loss, and curve fitting the determined equivalent series resistance values of the primary unit to determine a primary unit eddy current power loss coefficient for estimating primary unit eddy current power loss. It is worth noting that because the primary unit in the current embodiment adjusts operating frequency in dependence on the load present in the system, by changing the load or the position of the load, the primary unit changes frequency. These changes in frequency can affect the power losses in the system.

Although the above embodiment are described in connection with a single secondary device, during operation or calibration multiple secondary devices may be accounted for. That is, the formula and coefficients can be expanded to account for all known secondaries in the system and the losses associated with those secondaries. For each secondary device, each of the secondary device power losses is duplicated.

The above description is that of current embodiments of the invention. Various alterations and changes can be made without departing from the spirit and broader aspects of the invention as defined in the appended claims, which are to be interpreted in accordance with the principles of patent law including the doctrine of equivalents. Any reference to claim elements in the singular, for example, using the articles "a," "an," "the" or "said," is not to be construed as limiting the element to the singular. It is to be understood that the invention disclosed and defined herein extends to all alternative combinations of two or more of the individual features mentioned or evident from the text and/or drawings. All of these different combinations constitute various alternative aspects of the present invention.

The invention claimed is:

1. A method of controlling an inductive power transfer circuit the method comprising:
measuring an input characteristic of input power in a primary circuit,
wherein the primary circuit comprises a tank circuit and a switching circuit,
wherein the primary circuit generates an electromagnetic field;
measuring a tank characteristic of power in the tank circuit;
receiving, in the primary circuit, secondary device information from a at least one secondary device, wherein the secondary device is arranged to couple to the primary circuit via the electromagnetic field;
estimating power consumption in the inductive power transfer system as a function of at least the tank characteristic;
comparing the input characteristic, the secondary device information, and the estimated power consumption to determine when there is an unacceptable amount of parasitic metal present in proximity to the primary circuit; and
restricting or stopping the inductive power transfer from the primary circuit in response to a determination that the unacceptable amount of parasitic metal is present in proximity to the primary circuit.

2. The method as claimed in claim 1, wherein the estimating power consumption comprises at least one of estimating power loss in the inductive power transfer system, estimating power used by a load of the secondary device, or a combination thereof.

3. The method as claimed in claim 1, wherein the estimating power consumption comprises estimating power loss in the inductive power transfer system as a function of the tank characteristic and the secondary device information.

4. The method as claimed in claim 1,
wherein the switching circuit operates at an operating frequency,
wherein the operating frequency changes during operation,
wherein the estimating power consumption comprises estimating power loss in the inductive power transfer system as a function of the tank characteristic , the secondary device information, and the operating frequency.

5. The method as claimed in claim 1, wherein the estimating power consumption comprises:
estimating primary circuit hysteresis power loss;
estimating primary circuit eddy current power loss;
estimating primary circuit voltage power loss;
estimating primary circuit resistive power loss; and
estimating secondary device power consumption.

6. The method as claimed in claim 5, wherein estimating secondary device power consumption comprises:
estimating secondary device eddy current power loss;
estimating secondary device voltage power loss; and
estimating secondary device resistive power loss.

7. The method as claimed in claim 5, wherein estimating secondary device power consumption comprises estimating secondary device eddy current power loss and estimating secondary device hysteresis as a function of the tank characteristic.

8. The method as claimed in claim 1, wherein the secondary device information is selected from the group consisting of a secondary device ID, a measurement of a characteristic of power in the secondary device, an estimation of power loss in the secondary device, one or more power loss coefficients.

9. The method as claimed in claim 1, wherein the secondary device information comprises:
synchronization information for synchronizing the input characteristic;
the secondary device information; and
the estimated power consumption.

10. The method as claimed in claim 1, wherein the input characteristic comprises a current or voltage in the primary circuit before the switching circuit and the tank circuit.

11. The method as claimed in claim 1, wherein the tank characteristic comprises a current or voltage in the tank circuit.

12. The method as claimed in claim 1, wherein comparing the input characteristic, secondary device information, and the estimated power consumption to determine when there is an unacceptable amount of parasitic metal present in proximity to the primary circuit further comprises:
calculating the total power consumption based on the input characteristic and the secondary device information; and
determining that there is a foreign object present in proximity to the primary circuit by detecting a difference between the calculated total power consumption and the estimated power consumption.

13. The method as claimed in claim 1, further comprising determining that the unacceptable amount of parasitic metal is present in proximity to the primary circuit when the difference between the calculated total power consumption and the estimated power consumption exceeds a threshold value.

14. The method as claimed in claim 1, further comprising:
placing the secondary device in a plurality of different positions with respect to the primary circuit;
for each position, determining an equivalent series resistance value of the secondary device; and
determining an eddy current power loss coefficient for estimating secondary device eddy current power loss based on the equivalent series resistance values of the secondary device.

15. The method as claimed in claim 1, further comprising:
placing the secondary device in a plurality of different positions with respect to the primary circuit and operating the primary circuit at a plurality of different operating frequencies;
for each position and operating frequency combination, determining an equivalent series resistance value of the secondary device; and
determining an eddy current power loss coefficient for estimating secondary device eddy current power loss based on the equivalent series resistance values of the secondary device.

16. The method as claimed in claim 15, wherein determining an equivalent series resistance value of the secondary device comprises measuring an equivalent series resistance of the primary circuit, measuring an equivalent series resistance of the inductive power transfer system, and subtracting the equivalent series resistance of the primary circuit from the equivalent series resistance of the inductive power transfer system to determine the equivalent series resistance value of the secondary device.

17. The method as claimed in claim 15,
wherein the primary circuit comprises:
a primary circuit shield; and
a primary circuit magnet;
wherein the primary circuit tank circuit comprises a primary circuit coil,
wherein the secondary device comprises:
a secondary coil;
a shield; and
a secondary friendly parasitic metal.

18. The method as claimed in claim 1, further comprising:
placing the secondary device in a plurality of different positions with respect to the primary circuit;
operating the primary circuit at a plurality of different operating frequencies;
connecting a plurality of different loads to the secondary device;
for each position, operating frequency, and load combination, determining an equivalent series resistance value of the secondary device; and
determining an eddy current power loss coefficient for estimating secondary device eddy current power loss based on the equivalent series resistance values of the secondary device.

19. A method of designing an inductive power transfer system with power accounting comprising:
providing a primary side with a tank circuit;
providing a secondary side,
wherein the secondary side comprises a secondary coil and a load,
wherein the secondary coil is arranged to receive contactless energy from the primary side;
changing the distance between the primary side and the secondary side;
changing the load;
for a plurality of distances between the primary side and the secondary side and for a plurality of loads, measuring at least one primary circuit parameter on the primary side in the tank circuit during the transfer of contactless energy;
for a plurality of distances between the primary side and the secondary device and for a plurality of loads of the secondary side, measuring at least one secondary circuit parameter on the secondary side during the transfer of contactless energy;
selecting a formula to describe power consumption in the system during the transfer of contactless energy based on a plurality of coefficients, the at least one primary circuit parameter, and the at least one secondary circuit parameter;
determining the coefficients using the at least one secondary circuit parameter and the at least one primary circuit parameter; and
storing the coefficient in the inductive power transfer system for use in predicting whether unaccounted for losses during operation are present.

20. The method of claim 19, wherein the determining of the coefficients is based on the type of power loss through physical observation of components in the system.

21. The method of claim 19, wherein the determining comprises determining the coefficients by curve fitting.

22. The method of claim 21, wherein the curve fitting uses multivariate polynomial regression.

23. The method of claim 19, further comprising storing at least one coefficients in a primary circuit and storing at least one coefficients on a secondary device.

24. The method as claimed in claim 19, wherein the formula comprises an estimation of power loss in the primary side, an estimation of power loss in the secondary side, and an estimation of power used by the load.

25. The method as claimed in claim 19, wherein the formula comprises an estimation of power loss in the inductive power transfer system as a function of the circuit parameter of the primary side and the circuit parameter of the secondary side.

26. The method as claimed in claim 19, further comprising for a plurality of operating frequencies in the primary circuit, measuring at least one circuit parameter on the secondary side during the transfer of contactless energy and measuring at least one circuit parameter on the primary side in the tank circuit during the transfer of contactless energy.

27. The method as claimed in claim 19,
wherein the formula comprises an estimation of primary side hysteresis power loss,
wherein the formula comprises primary side eddy current power loss,
wherein the formula comprises primary side voltage power loss,
wherein the formula comprises primary side resistive power loss,
wherein the formula comprises secondary side power consumption.

28. The method as claimed in claim 27,
wherein the secondary side power consumption comprises secondary side eddy current power loss,
wherein the secondary side power consumption comprises secondary side voltage power loss,
wherein the secondary side power consumption comprises secondary side resistive power loss.

29. The method as claimed in claim 27, wherein the formula comprises an estimation of secondary side eddy current power loss and secondary side hysteresis power loss as a function of the circuit parameter in the tank circuit.

30. The method as claimed in claim 19, wherein the circuit parameter in the tank circuit comprises at least one of a current and a voltage in the tank circuit.

31. The method as claimed in claim 19, further comprises:
for each distance between the primary side and the secondary side, determining an equivalent series resistance value of the secondary side; and
determining an eddy current power loss coefficient based on the equivalent series resistance values.

32. The method as claimed in claim 25, further comprising:
for each combination of distance between the primary side and the secondary side and operating frequency, determining an equivalent series resistance value of the secondary device;
determining an eddy current power loss coefficient based on the equivalent series resistance values.

33. A primary circuit comprising:
a tank circuit;
a switching circuit, wherein the primary circuit is arranged to generate an electromagnetic field, wherein the primary circuit is arranged to couple to the secondary device using the electromagnetic field, a sensor for measuring an input characteristic of input power in the primary circuit;

a sensor for measuring a tank characteristic of power in the tank circuit;

a receiver circuit, wherein the receiver circuit is arranged to receive secondary device information from the at least one secondary device;

a controller circuit, wherein the controller circuit is programmed to estimate power consumption in the primary circuit in combination with the secondary device as a function of at least the tank characteristic;

wherein the controller circuit is programmed to compare the input characteristic, the secondary device information, and the estimated power consumption to determine when there is an unacceptable amount of parasitic metal present in proximity to the primary circuit; and wherein the controller circuit is programmed to restrict or stop the inductive power transfer from the primary circuit in response to a determination that the unacceptable amount of parasitic metal is present in proximity to the primary circuit.

34. The primary circuit as claimed in claim 33, wherein the estimate of power consumption of the primary circuit in combination with the secondary device comprises an estimate of power used by a load of the secondary device.

35. The primary circuit as claimed in claim 33, wherein the estimate of power consumption of the primary circuit in combination with the secondary device comprises an estimate of power loss as a function of the tank characteristic and the secondary device information.

36. The primary circuit as claimed in claim 33, wherein the switching circuit operates at an operating frequency, wherein the operating frequency changes during operation, wherein the estimate of power consumption of the primary circuit in combination with the secondary device comprises an estimate of power loss as a function of the tank characteristic, the secondary device information, and the operating frequency of the switching circuit.

37. The primary circuit as claimed in claim 33, wherein the estimate of power consumption comprises:

an estimate of primary circuit hysteresis power loss;
an estimate of primary circuit eddy current power loss;
an estimate of primary circuit voltage power loss;
an estimate of primary circuit resistive power loss; and
an estimate of secondary device power consumption.

38. The primary circuit as claimed in claim 37, wherein the estimate of secondary device power consumption comprises an estimate of secondary device eddy current power loss;
an estimate of secondary device voltage power loss; and
an estimate of secondary device resistive power loss.

39. The primary circuit as claimed in claim 36, wherein the estimate of secondary device power loss comprises:

an estimate of secondary device eddy current power loss; and
an estimate of secondary device hysteresis as a function of the tank characteristic.

40. The primary circuit as claimed in claim 33, wherein the secondary device information is selected from the group consisting of a secondary device ID, a measurement of a characteristic of power in the secondary device, an estimation of power loss in the secondary device, or at least one power loss coefficients.

41. The primary circuit as claimed in claim 33, wherein the secondary device information comprises:

synchronization information for synchronizing the input characteristic;
the secondary device information; and
the estimated power consumption.

42. The primary circuit as claimed in claim 33, wherein the input characteristic comprises a current or voltage in the primary circuit before the switching circuit and the tank circuit.

43. The primary circuit as claimed in claim 33, wherein the tank characteristic comprises a current or voltage in the tank circuit.

44. The primary circuit as claimed in claim 33, wherein the compare comprises:

a calculation of the total power consumption based on the input characteristic and the secondary device information; and
a determination that there is a foreign object present in proximity to the primary circuit by a detection a difference between the calculated total power consumption and the estimated power consumption.

45. The primary circuit as claimed in claim 33, wherein the controller circuit determines that the unacceptable amount of parasitic metal is present in proximity to the primary circuit when the difference between the calculated total power consumption and the estimated power consumption exceeds a threshold value.

* * * * *